United States Patent [19]
Bruce et al.

[11] Patent Number: 6,008,533
[45] Date of Patent: Dec. 28, 1999

[54] CONTROLLING IMPEDANCES OF AN INTEGRATED CIRCUIT

[75] Inventors: Jeffrey D. Bruce; Gordon D. Roberts, both of Merdian; Aaron M. Schoenfeld, Boise, all of Id.

[73] Assignee: Micron Technology, Inc., Boise, Id.

[21] Appl. No.: 08/987,000

[22] Filed: Dec. 8, 1997

[51] Int. Cl.$^6$ .................................................. H01L 23/52
[52] U.S. Cl. ........................... 257/691; 257/664; 257/723
[58] Field of Search ..................................... 257/664, 723, 257/724, 698, 691, 786, 780, 784

[56] References Cited

U.S. PATENT DOCUMENTS

| | | |
|---|---|---|
| 4,393,392 | 7/1983 | Hale . |
| 4,720,915 | 1/1988 | Kennedy et al. . |
| 4,751,482 | 6/1988 | Fukuta et al. . |
| 5,006,673 | 4/1991 | Freyman et al. . |
| 5,371,405 | 12/1994 | Kagawa . |
| 5,616,952 | 4/1997 | Nakano et al. . |
| 5,677,570 | 10/1997 | Kondoh et al. . |
| 5,789,816 | 8/1998 | Wu . |

Primary Examiner—Sheila V. Clark
Attorney, Agent, or Firm—Trop, Pruner, Hu & Miles, P.C.

[57] ABSTRACT

A semiconductor assembly includes two leads, a primary die and a secondary support structure. Impedance networks of the secondary support structure establish an impedance between each lead and a different bond pad of the primary die. Although the distances between each bond pad and lead are substantially different, the impedances between each bond pad and lead are substantially the same.

25 Claims, 4 Drawing Sheets

CONTROLLING IMPEDANCES OF AN INTEGRATED CIRCUIT

The invention relates to controlling impedances of an integrated circuit.

Referring to FIG. 1, an integrated circuit chip, or package 10, typically includes a semiconductor die 17; pins, or leads 12; and a packaging material 3 that encapsulates the die 17 and holds the leads 12 in place. The core circuitry of the package 10 is fabricated in the semiconductor die 17, and the leads 12 form terminals for electrically connecting the circuitry on the die 17 with external circuitry.

Referring to FIG. 2, one way to make the package 10 includes mounting the die 17 on a center piece, or paddle 18, of an electrically conductive leadframe 11. Either a conductive or a nonconductive adhesive (e.g., an epoxy) may be used to secure the die 17 to the paddle 18. When a conductive adhesive is used, a dielectric layer may be placed between the die 17 and the paddle 18. During the initial stages of manufacture of the package 10, the leads 12 are an integral part of the leadframe 18 and extend inwardly toward the die 17.

To electrically connect the die 17 to the leads 12, bonding wires 14 are attached between the leads 12 and bond pads 15 of the die 17. One of the final steps of making the package 10 includes encapsulating the die 17 with the packaging material 3 which leaves a portion of the leads 12 exposed. After the encapsulation, the webbing of the leadframe 11 that connects the leads 12 together is cut away to electrically isolate the leads 12.

Referring to FIG. 3, another way to make an integrated circuit package 20 includes eliminating the bond wires 14 and alternatively mounting leads 22 of a different type of leadframe 26 directly to the die 17. Often called "tab bonding," the free ends of the leads 22 extend over the die 17 and mount directly to the bond pads 15 (shown in FIG. 3 by dotted lines). Besides establishing electrical connections with the die 17, the leads 22 also secure the die 17 to the leadframe 26. Regardless of whether the leads are directly mounted to the bond pads or mounted via bond wires, the extension of the leads over the die is often called a leads over chip (LOC) mounting scheme.

The different leads 12 are used for different purposes. For example, some of the leads 12 might be used to establish a ground connection, some might be used to carry supply voltages, and some might be used to connect circuitry on the die 17 to external components (e.g., a crystal or a large resistor) that are not fabricated on the die 17. Quite often, some of the leads 12, are used as I/O pins to transmit and receive data, control and address signals.

These I/O pins might be used to transmit and receive high frequency signals, such as, for example, signals that represent bits of data for a high speed memory device. At these high frequencies, even slight differences in the length of the bond wires 14 may cause the impedances present at the I/O pins to vary among the pins.

As an example of different bond wire lengths, a lead 12b(see FIG. 4) might be connected to a bond pad 15b(via a bond wire 14b) that is located near an edge (of the die 17) that is close to the lead 12b. However, a lead 12a that is adjacent to the lead 12b might be connected to a bond pad 15a(via a bond wire 14a) that is located near an opposite edge of the die 17. As a result, the impedances present at the two leads 12a and 12b are substantially different which can affect the performance of the package 10.

SUMMARY OF THE INVENTION

In one aspect, the invention is generally directed to supplementing a primary die of an integrated circuit package with a secondary support structure for the purpose of matching impedances present at the external pins of the integrated circuit package.

The advantages of the invention may include one or more of the following. Impedances can be precisely matched. The secondary support structure has enough room, or "real estate," to ensure impedances are matched. The secondary support structure can be used with different sized primary dies. No modifications to the leadframe are required. Bond options permit more than one impedance path, and for each path, bond wires have the same length. Bond pads can be placed on all sides of the die. Reclaimed wafers can be used for the secondary support structure. A flip chip mounting scheme can be used to mount the primary die and the secondary support structure together.

Generally, in one aspect, the invention features a semiconductor assembly that includes two leads, a primary die and a secondary support structure. Impedance networks of the secondary support structure establish an impedance between each lead and a different bond pad of the primary die. Although the distances between each bond pad and lead are substantially different, the impedances between each bond pad and lead are substantially the same.

In implementations of the invention, the primary die may be mounted either on top or beside of the secondary support structure. The secondary support structure may be a semiconductor die and may be a printed circuit board. The first network may include a conductive trace and may include a capacitor. The assembly may also include leads which are electrically connected to the bond pads of the secondary support structure.

Generally, in another aspect, the invention features a semiconductor assembly that includes a primary die and a secondary support structure. The primary die includes two circuits and two bond pads. The impedance between one of the circuits and one of the bond pads is substantially different than the impedance between the other circuit and the other bond pad. The secondary support structure includes two bond pads and two networks. One of the networks is electrically connected to one of these bond pads, and the other network is electrically connected to the other bond pad. The networks are configured to establish substantially the same impedance between the bond pads of the secondary support structure and the circuits of the primary die.

Generally, in another aspect, the invention features a semiconductor assembly that has a primary die and a secondary support structure. The primary die includes a bond pad and is capable of having one of a number of sizes. The secondary support structure includes at least two bond pads. One bond pad of the secondary support structure is for establishing an electrical connection between the bond pad of the primary die when the primary die has a first size. The other bond pad of the secondary support structure is for establishing an electrical connection between the bond pad of the primary die when the primary die has a second size different from the first size.

Generally, in another aspect, the invention features a semiconductor assembly that includes a primary die and a secondary support structure. The primary die has a bond pad. This bond pad is located near at least two bond pads of the primary die. The primary die also has impedance networks and a bond pad for forming a connection with a lead. Each different impedance network is electrically connected between the bond pad for forming the connection with the lead and the two pads that are near the bond pad of the primary die.

Generally, in another aspect, the invention features a method for use with a primary semiconductor die and a secondary support structure. The method includes the act of mounting the primary die to a lead frame so that a first lead finger of the frame is located a first distance from a first bond pad of the primary die and a second lead finger of the frame is located a second distance from a second bond pad of the primary die. The first distance is substantially different than the second distance. A secondary support structure is used to establish a first impedance between the first lead finger and the first bond pad that is substantially the same as a second impedance between the second lead finger and the second bond pad.

Generally, in another aspect, the invention features a method for use with a secondary support structure and a primary semiconductor die that is capable of having different sizes. The method includes the act of using a first bond pad of the secondary support structure to mount to a bond pad of the primary semiconductor die when the primary die is a first size. A second bond pad of the secondary support structure is used to mount to the bond pad of the primary semiconductor die when the primary die is a second size.

Generally, in another aspect, the invention features a semiconductor assembly that includes a primary die, data pins, control pins, address pins and a secondary support structure. The secondary support structure is electrically o the primary die and all of these pins. The secondary support structure is configured to cause impedances measured from the control pins, address pins and data pins toward the primary die to be substantially the same.

Generally, in another aspect, the invention features a method for use with a primary semiconductor die and a secondary support structure. The method includes the act of forming a first impedance network on the secondary support structure to establish a first impedance between the primary die and a lead. A second impedance network is formed on the secondary support structure to establish a second impedance between the primary die and a lead. A bond option is used to select either the first or second impedance network.

Other advantages and features will become apparent from the following description and from the claims.

DESCRIPTION OF THE PREFERRED EMBODIMENTS

Figure 1:
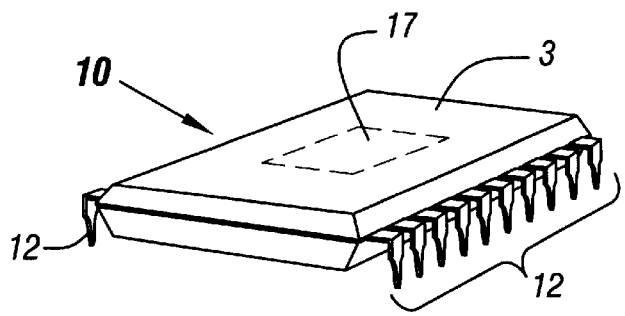
FIG. 1 is perspective view of a semiconductor package.
Figure 2:
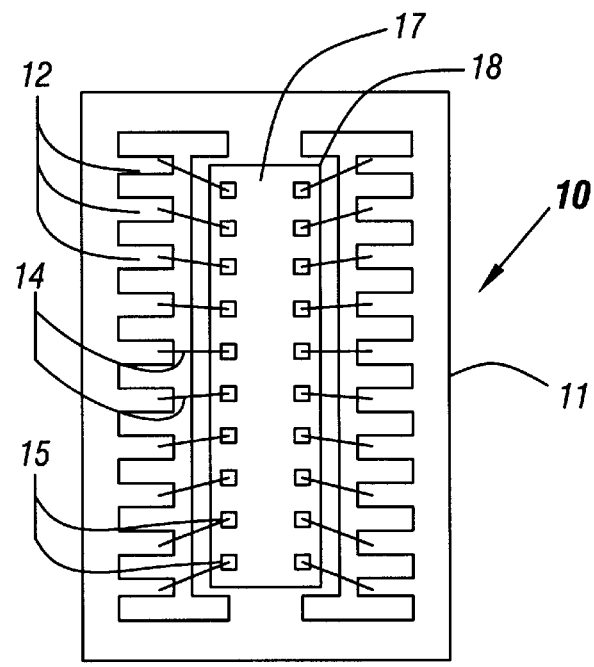
FIGS. 2 and 3 are top plan views of semiconductor dies that are mounted on leadframes.
Figure 3:
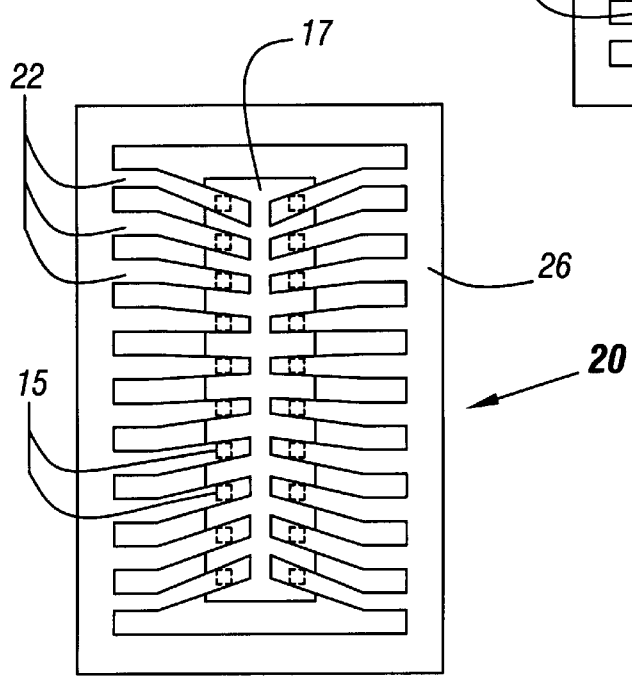
Figure 4:
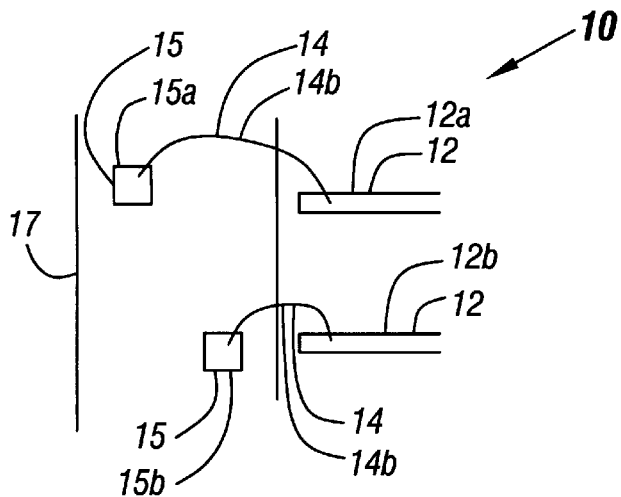
FIG. 4 is a top plan view of bond wires connecting a die to leads.
Figure 5:
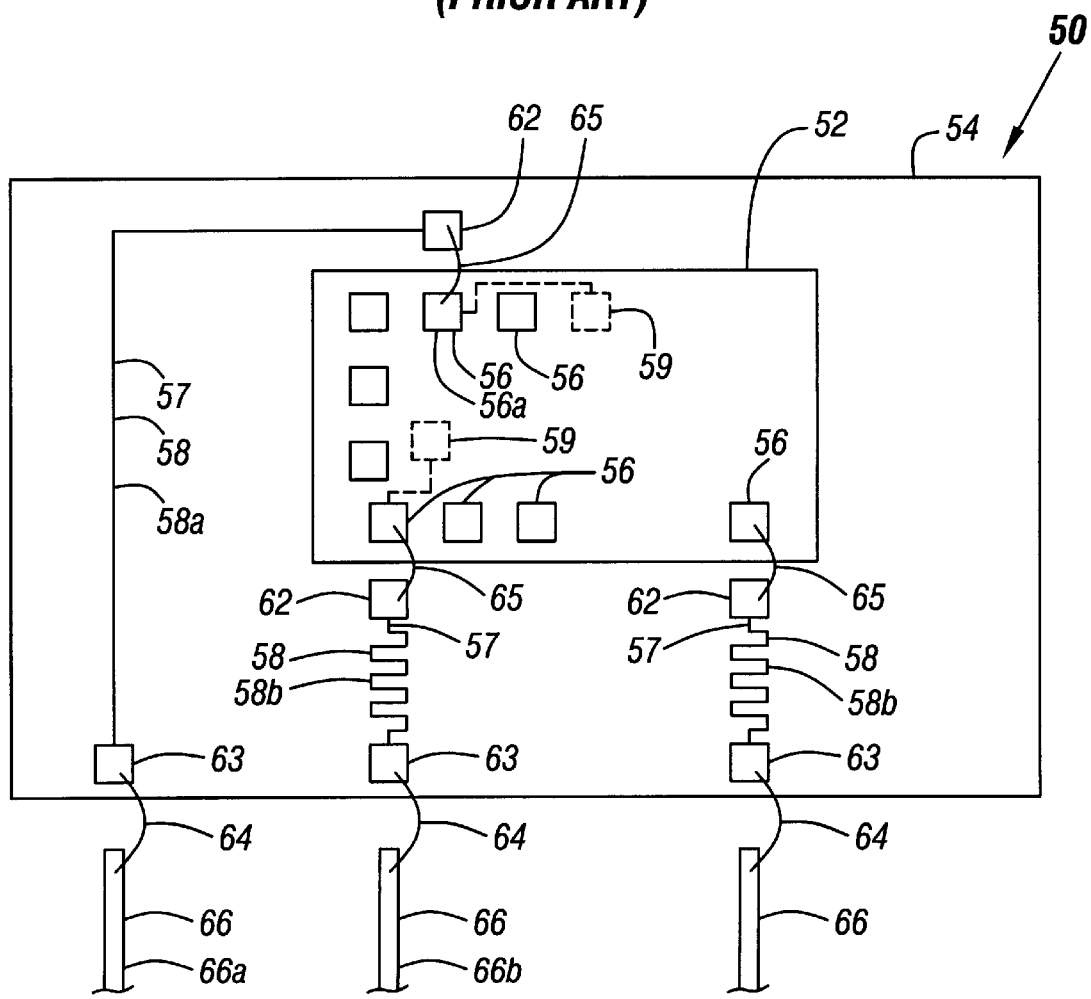
FIG. 5 is a top plan view of a primary die mounted on a secondary support structure.

Referring to FIG. 5, an integrated circuit package 50 includes a primary die 52 which has core circuitry of the package 50. Accompanying the primary die 52 inside the package 50 is a secondary support structure, such as a secondary die 54, that is constructed to match the impedances present at I/O pins of the package 50.

To match the impedances that are present at the pins, the secondary die 54 has impedance matching networks 58, each of which extend between bond pads 62 and 63 of the die 54. Each bond pad 62 is electrically connected via a bond wire 65 to a bond pad 56 on the primary die 52. The bond pad 56, in turn, is electrically connected to a circuit 59 (e.g., an I/O circuit, such as a driver or receiver) of the primary die 52. The bond pad 63 is electrically connected via a bond wire 64 to one of the leads 66 that form the I/O pins. Thus, each impedance matching network is serially coupled between one bond pad 56 and one lead 66.

Each network 58 is designed to compensate for such factors as lengths of conductive traces, bond wire length, routing paths and parasitic elements (e.g., parasitic inductance and capacitance) that might otherwise affect the input/output impedance as measured from the lead toward the package 50. For example, the bonding pads 56a and 56b are constructed to be electrically connected to the leads 66a and 66b, respectively, although the distance between the bonding pad 56a and the pin 66a is substantially farther than the distance between the bonding pad 56b and the lead 66b. Therefore, if the secondary support structure 52 were not used and bond wires were used to directly connect these pads to the respective leads, the input/output impedances of the leads 66a and 66b would be substantially different.

However, with the networks 58a and 58b, these distances are taken into account. In the simplest case, the networks 58a and 58b are conductive traces 57 formed in a metal layer of the primary die 52, and the lengths of the two traces 57 are the same. To accomplish this uniformity in length, the trace 57 of the network 58b follows a tortuous path which has the same length as the orthogonal path of the trace 57 of the network 58a. Because the two traces 57 have the same length, the resistance and inductance of the networks 58a and 58b are substantially the same, and as a result, the impedances present at the leads 66a are substantially the same.

Although in some embodiments the length of the bond wires 65 are the same, in other embodiments, the length of the bond wires 65 are different. However, the networks 58 are designed to compensate for the differences, if any.

Figure 7:
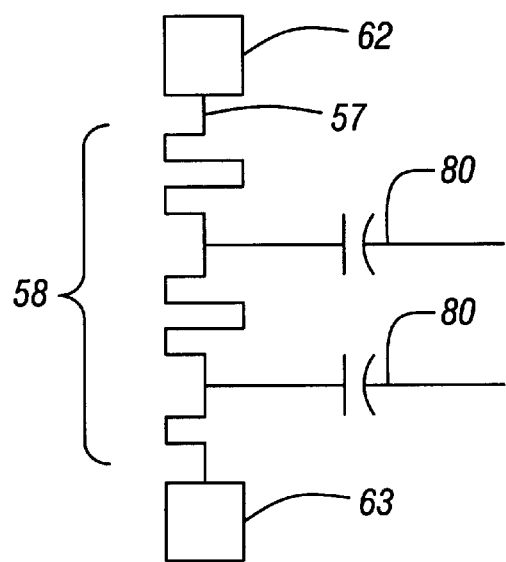
FIG. 7 is a schematic view of an impedance matching network of the secondary support structure.

Referring to FIG. 7, the network 58 might include compensation elements other than the conductive trace 57. For example, one or more of the networks 58, in some embodiments, include(s) one or more capacitors 80 that are formed in the die 54.

The primary die 52, in some embodiments, is mounted on top of the secondary die 54 (i.e., mounted in a "piggy back arrangement") as shown in FIG. 5. For the piggy back arrangement, the primary die 52 is mounted on top of the secondary die 54 by either a conductive or nonconductive adhesive (e.g., an epoxy). If a conductive adhesive is used and conductive traces are exposed in surface region of the secondary die 54 where the primary die 52 is to be mounted, then a dielectric film is placed between the primary 52 and secondary 54 dies.

Alternatively, the primary die 52, in some embodiments, is mounted to the secondary die 54 via a flip chip mounting scheme. In this scheme, the primary die 52 is mounted face down on the secondary die 54. In this manner, the bond pads 56 of the primary die 52 are mounted directly (via solder) to the bond pads 62 of the secondary die 54.

Figure 6:
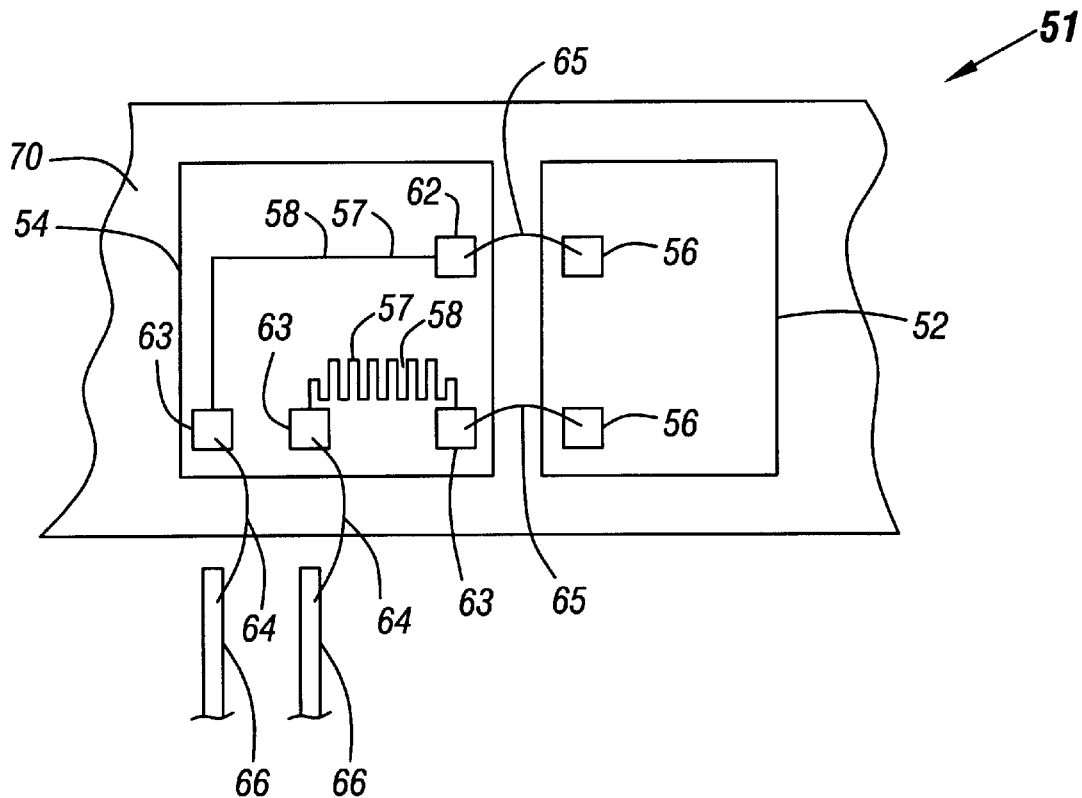
FIG. 6 is a top plan view of a primary die mounted beside of the secondary support structure.

Referring to FIG. 6, in other embodiments, the primary 52 and secondary 54 dies are mounted side-by-side on a paddle 70 of a leadframe. Although the length of the bond wires 65 can be different, the networks 58 are designed to take the differences, if any, in the length of the bond wires into account. The primary 52 and secondary 54 dies are mounted to the paddle 70 using same technique as that used to mount the primary die 52 to the secondary die 54, as described above.

Figure 8:
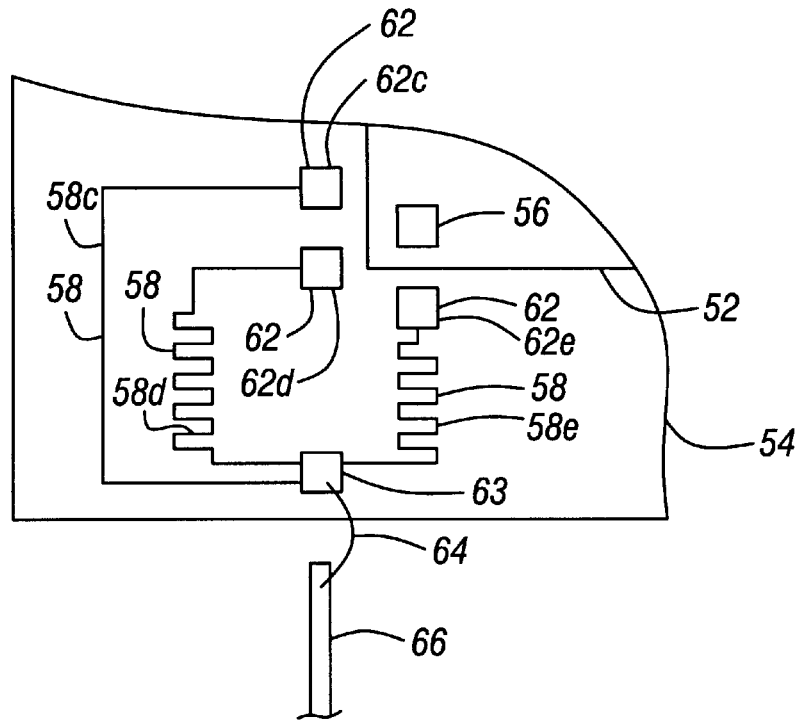
FIG. 8 is a top plan view of a primary die mounted on a secondary support structure showing different bond options to select different impedances.

Referring to FIG. 8, in some embodiments, the impedance between a particular bond pad 56 and a particular bond pad 63 is selectable via bond options. Selectable impedance paths might be desirable, for example, when the longest impedance path might vary depending on the size of the primary die 52. Also, selectable impedance paths might be desirable to allow flexibility when precisely matching the impedances of the leads.

As an example of the selectable impedance paths, one of three impedance networks 58 (i.e., network 58c, 58d or 58e) may be chosen to establish the impedance between, for example, the bond pad 56 and the bond pad 63. To accomplish this, the impedance networks 58c, 58d and 58e are connected at one end to the bond pad 63. The other ends of the networks 58c, 58d and 58e are connected to three separate bond pads 62c, 62d and 62e, respectively. A bond wire is used to select one of the networks 58c, 58d and 58e by connecting the bond pad 56 to either the bond pad 62c, 62d or 62e.

In some embodiments, the distances between the bond pad 56 and the bond pads 62c, 62d and 62e are approximately the same.

Figure 9:
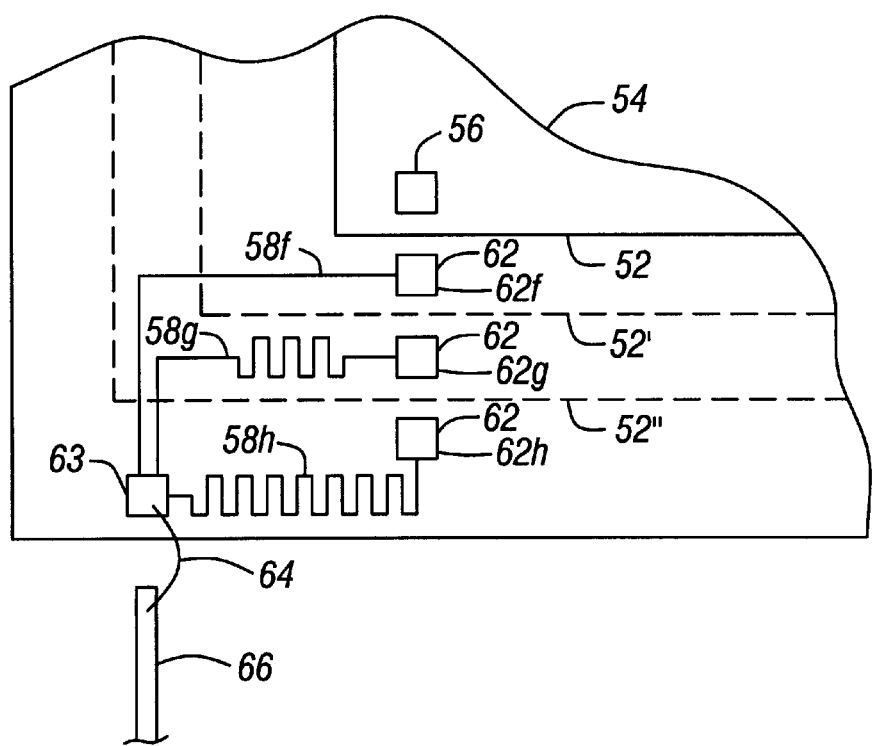
FIG. 9 is a top plan view of a primary die mounted on a secondary support structure showing different bond options to select networks for different primary die sizes.

Referring to FIG. 9, the same secondary die 54 can be used with different sized primary dies 52 (e.g., primary dies 52, 52' and 52"). To keep the length of the bond wires 65 approximately the same for all primary die sizes, in some embodiments, bond options are used to select one of a set of bond pads 62 (e.g., bond pad 62f, 62g or 62h) for each pad 56. In this manner, one bond pad 62f is used for a small primary die 52, one bond pad 62g is used for an intermediate primary die 52' and one bond pad 62h is used for a large primary die 52'. Depending on the size of the primary die 52, the die 52 may cover up one or more of the bond pads 62f, 62g and 62h.

Impedance networks 58f, 58g and 58h extend from each of the pads 62f, 62g and 62h, respectively, to one of the pads 63. A bond wire is used to connect the bond pad 56 to one of the pads 62f, 62g or 62h, depending on the size of the primary die 54. In some embodiments, the impedances of the networks 58d, 58e and 58f are different.

Other embodiments are within the scope of the following claims. For example, the secondary semiconductor die, in other embodiments, is replaced by another structure, such as, for example, a printed circuit board, that is capable of supporting impedance matching networks. As another example, in other embodiments, the primary die may be mounted face down on the secondary die in a flip chip scheme, and bonding pads on either die may directly bond to the lead fingers via a tab bonding scheme.

What is claimed is:

1. A semiconductor assembly comprising:
  a first lead;
  a second lead;
  a primary die comprising:
    a first bond pad located a first distance from the first lead;
    a second bond pad located a second distance from the second lead, the second distance being substantially different from the first distance; and
  a secondary support structure comprising:
    a first impedance matching network establishing a first impedance between the first lead and the first bond pad; and impedance between the first lead and the first bond pad; and
    a second impedance matching network establishing a second impedance between the second lead and the second bond pad and wherein said impedance matching networks establish matching impedances between each of said first and second bond pads and each of said first and second leads have differing first and second distances and wherein said first and second leads, said primary die and said secondary support structure being arranged such that they may be electrically coupled to one another.

2. The semiconductor assembly of claim 1, wherein the first network comprises a conductive trace.

3. The semiconductor assembly of claim 1, wherein the first network comprises a capacitor.

4. The semiconductor assembly of claim 1, further comprising:
  a first lead finger electrically connected to the third bond pad; and
  a second lead finger electrically connected to the fourth bond pad.

5. The semiconductor assembly of claim 1, wherein the first die is mounted on the second die.

6. The semiconductor assembly of claim 1, further comprising a lead frame and wherein the first and second dies are mounted beside one another on the lead frame.

7. The semiconductor assembly of claim 1, wherein the secondary support structure comprises a semiconductor die.

8. The semiconductor assembly of claim 1, wherein the secondary support structure comprises a printed circuit board.

9. A semiconductor assembly comprising:
  a first circuit;
  a second circuit;
  a primary die comprising:
    a first bond pad, a first impedance existing between the first bond pad and the first circuit;
    a second bond pad, a second impedance existing between the second bond pad and the second circuit, the second impedance being different from the first impedance; and a
  a secondary support structure comprising:
    a third bond pad;
    a fourth bond pad;
    a first network electrically connected to the first bond pad and configured to establish a first overall impedance between the third bond pad and the first circuit; and
    a second impedance matching network electrically connected to the second bond pad and configured to establish a second overall impedance between the fourth bond pad and the second circuit wherein said impedance matching networks establish matching impedances between said bond pads and said circuits, and wherein said first and second circuits and said primary die and said secondary support structure being arranged such that they may be electrically coupled to one another.

10. The semiconductor assembly of claim 9, further comprising:

a first lead electrically connected to the third bond pad, the first lead located a first distance from the first bond pad; and a second lead electrically connected to the fourth bond pad, the second lead located a second distance from the second bond pad, the first and second distances being substantially different.

11. The semiconductor assembly of claim 9, wherein the first die is mounted on the second die.

12. The semiconductor assembly of claim 9, further comprising a lead frame and wherein the first and second dies are mounted beside one another on the lead frame.

13. The semiconductor assembly of claim 9, wherein the secondary support structure comprises a semiconductor die.

14. The semiconductor assembly of claim 9, wherein the secondary support structure comprises a printed circuit board.

15. A semiconductor assembly comprising:

a primary die, the primary die including a bond pad; and a secondary support structure including at least two bond pads, such that one of said bond pads on said secondary support structure may be electrically coupled to the bond pad on said primary die; wherein the secondary support structure has an additional bond pad and wherein an impedance matching network is located between each of said at least two bond pads of the secondary support structure and said additional bond pad wherein said impedance matching network allows for selectable impedance paths between each of said bond pads and additional bond pad.

16. The semiconductor assembly of claim 15, wherein the primary die is mounted on the secondary support structure.

17. The semiconductor assembly of claim 15, wherein the primary die is mounted beside of the secondary support structure.

18. The semiconductor assembly of claim 15, wherein the secondary support structure comprises a semiconductor die.

19. The semiconductor assembly of claim 15, wherein the secondary support structure comprises a printed circuit board.

20. A semiconductor assembly comprising;

a primary die having a bond pad; and a secondary support structure comprising:

a first bond pad for forming a connection with a lead;

at least two second bond pads located neat the bond pad of the primary die; and impedance matching networks between said first bond pads and each of a different one of the second bond pads wherein said impedance matching networks establish matching impedances between each of said first and second bond pads.

21. The semiconductor assembly of claim 20, wherein the primary die is mounted on the secondary support structure.

22. The semiconductor assembly of claim 20, wherein the primary die is mounted beside of the secondary support structure.

23. The semiconductor assembly of claim 20, further comprising a bond wire connecting the bond of the primary die and one of the second bond pads.

24. The semiconductor assembly of claim 20, wherein the secondary support structure comprises a semiconductor die.

25. The semiconductor assembly of claim 20, wherein the secondary support structure comprises a printed circuit board.

* * * * *

UNITED STATES PATENT AND TRADEMARK OFFICE
CERTIFICATE OF CORRECTION

PATENT NO. : 6,008,533
DATED : December 28, 1999
INVENTOR(S) : JEFFREY D. BRUCE, GORDON D. ROBERTS and AARON M. SCHOENFELD It is certified that error appears in the above-identified patent and that said Letters Patent is hereby corrected as shown below:

In column 6, lines 6-7, after "and", please delete "impedance between the first lead and the first bond pad; and".

In column 6, line 48, please delete "a".

In column 6, line 52, after "first", please insert --impedance matching--.

In column 8, line 13, please replace "neat", with --near--.

Signed and Sealed this

First Day of August, 2000

*Attest:*

*Attesting Officer*

Q. TODD DICKINSON
*Director of Patents and Trademarks*